United States Patent [19]

Billman et al.

[11] Patent Number: 4,886,470
[45] Date of Patent: Dec. 12, 1989

[54] BURN-IN SOCKET FOR GULL WING INTEGRATED CIRCUIT PACKAGE

[75] Inventors: Timothy B. Billman, King; Joseph R. Goodman, Walkertown, both of N.C.

[73] Assignee: AMP Incorporated, Harrisburg, Pa.

[21] Appl. No.: 198,344

[22] Filed: May 24, 1988

[51] Int. Cl.[4] .......................................... H01R 13/634
[52] U.S. Cl. ..................................................... 439/266
[58] Field of Search ..................................... 439/68–73, 439/259–270, 330, 331; 174/52 FP

[56] References Cited

U.S. PATENT DOCUMENTS

| | | | |
|---|---|---|---|
| 4,461,525 | 7/1988 | Griffin | 339/75 |
| 4,470,650 | 9/1984 | Lundergan | 439/70 |
| 4,491,377 | 1/1985 | Pfaff | 339/74 |
| 4,498,047 | 2/1985 | Hexamer et al. | 324/158 |
| 4,533,192 | 8/1985 | Kelley | 339/45 |
| 4,623,208 | 11/1986 | Kerul et al. | 339/74 |
| 4,630,875 | 12/1986 | Korsunsky et al. | 339/17 |
| 4,645,279 | 2/1987 | Grabbe et al. | 339/17 |
| 4,669,796 | 6/1987 | Carter | 439/71 X |
| 4,678,255 | 7/1987 | Carter | 439/267 |
| 4,691,975 | 9/1987 | Fukunaga et al. | 439/266 |
| 4,715,823 | 12/1987 | Ezura et al. | 439/266 |
| 4,746,299 | 5/1988 | Matsuoka et al. | 439/70 |
| 4,750,890 | 6/1988 | Dube et al. | 439/152 |
| 4,801,273 | 1/1989 | Ikeya et al. | 439/70 X |

FOREIGN PATENT DOCUMENTS 463245 7/1975 U.S.S.R. .

Primary Examiner—Joseph H. McGlynn
Attorney, Agent, or Firm—Eric J. Groen; Robert W. Pitts

[57] ABSTRACT

An integrated circuit package socket includes an insulating housing having a plurality of side by side terminals profiled for receipt of a square package with leads extending therefrom. The socket also includes a camming member disposed above the housing which has a camming surface which contacts a portion of each of the terminals to move the terminals into and out of electrical engagement with the leads of the package. The camming member multiplies the force applied directly to the camming member to cause the desired rotation. Relaxation of the camming member causes a reverse rotation of the contacts into electrical engagement with the package leads.

6 Claims, 5 Drawing Sheets

BURN-IN SOCKET FOR GULL WING INTEGRATED CIRCUIT PACKAGE

BACKGROUND OF THE INVENTION

1. Field of the Invention

The subject invention relates to an electrical socket for a gull wing semiconductor package.

2. Description of the Prior Art

Semiconductor packages are arranged with several lead configurations denoting their use. One such semiconductor package is known as the gull wing package and includes a plurality of leads extending from the package body from all four side edges of the package body and all leads extending outwardly from a common flat plane. The leads are then bent downwardly and then flattened to form a plurality of feet which are in a plane which is beneath the bottom surface of the package body.

Typically, all semiconductor packages are tested in some manner to ensure their proper functioning, including burn-in testing where the devices are inserted into sockets and installed within large convection ovens and the packages are operated at elevated temperatures.

Semiconductor packages are now being manufactured in the four sided gull wing configuration with the lateral centerline between adjacent leads spaced apart 0.025 inches with as many as 244 leads extending from the package body. With an insertion force on each lead being approximately 0.25 pounds, the total insertion force for such a semiconductor package would be as high as 61 pounds total. The problem which resultantly exists is the necessity of an insertion and latching means which can progressively install the package leads yet maintain and retain the semiconductor package in an electrically connected condition with the terminals of the burn-in socket.

The package known as the gull wing semiconductor is a very fragile component and, often times the package is installed within a carrier which includes an insulative housing to surround the package body. The carrier is placed within the socket during the burn-in testing and, when completed, the carrier and package are removed and the semiconductor package is shipped within the carrier for protection of the package leads. One style of burn-in sockets presently available requires the semiconductor package and the carrier to be inserted within the sockets and requires the installer to exert a force directed onto the package carrier to a position where the package carrier clears a latching mechanism. Three problems are presented by such an arrangement.

First, burn-in cycling requires a massive "burn-in board" which is a printed circuit board having densely packed burn-in sockets aligned side-by-side and end-to-end on the board. To require the installer to insert this small semiconductor and carrier within the sockets requires a great deal of dexterity, as the carriers are in the range of one inch square, and also requires a lot of physical strength given that the force of 60 pounds must be concentrated on that small of a carrier.

Second, the contacts within the sockets can easily be damaged by the installer, if the carrier is over extended within the socket housing, the contacts can be over-stressed to the point of plastic deformation.

Third, these connectors are very labor intensive to use as the packages and carriers usually have to be hand installed and removed, with the covers manually closed opened, respectively.

Another style of burn-in connector is shown in U.S. Pat. Nos. 4,623,208 and 4,715,823; which include covers which overlie the plurality of electrical terminals within the housing. The terminals include portions in engagement with the cover, such that, downward movement of the cover rotates the contacts within the housing. One disadvantage to these type of connectors is that as the number of contacts increases, the downward force on the cover member too increases, to a point where the cover is very stiff and rigid, and not easily moved. This is predominantly true due to the geometry of the combination of the cover and the electrical terminals; in that the cover pushes directly against the terminals in a vertical direction downwards. The torque which can be obtained from this arrangement is limited however, since the terminals are not very wide, the moment arm is typically short, resulting in a small torque.

SUMMARY OF THE INVENTION

It is an object of the instant invention to provide an integrated circuit package connector which allows for an improved movement of the plurality of electrical terminals to allow for easier installation of the package.

The above mentioned object was accomplished by providing such an electrical connector with an insulative housing member having a lower base portion for mounting on a printed circuit board, and a nest for receipt of the integrated circuit package. A plurality of electrical terminals have portions extending through the base portion for interconnection to the traces on the printed circuit board and contact portions which are disposed in the nest for interconnection to the integrated circuit package leads. A lid portion is further provided which is disposed adjacent to an open upper face of the housing and is movable towards and away from the base portion, the lid portion having camming openings which overlie the terminals, the downward movement of the lid portion causing a camming surface of the lid portion to contact the terminals thereby forcing the terminal contact portions outwardly, from a center of the connector base portion, for insertion of the integrated circuit package.

DETAILED DESCRIPTION OF THE PREFERRED EMBODIMENT

Figure 1:
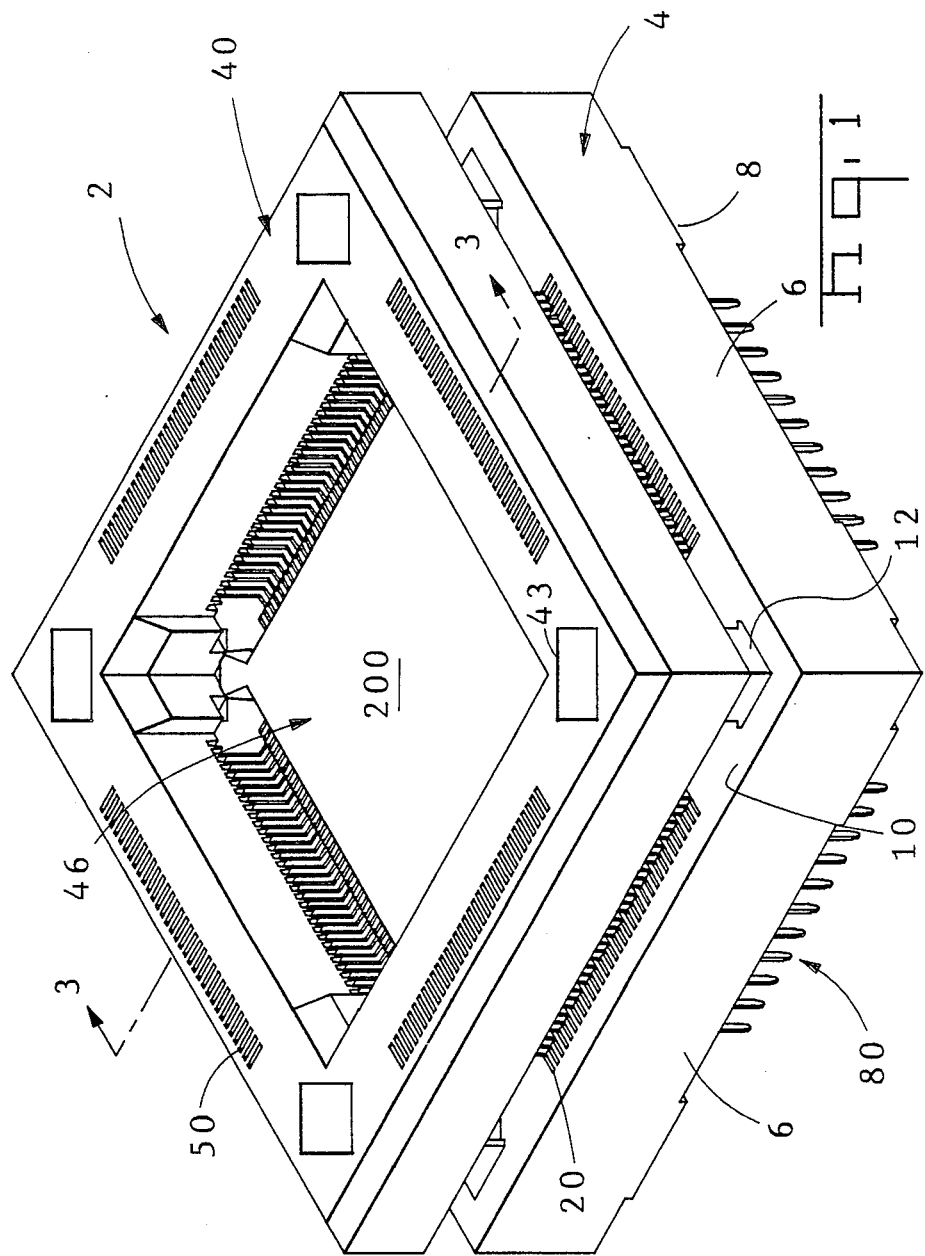
FIG. 1 is an isometric view of the connector in the connected condition.

With reference first to FIG. 1, the socket 2 of the instant invention includes a lower housing part 4, a camming member 40, and a plurality of terminals 80; the socket having the ability to interconnect an integrated circuit package 200 thereto. The preferred embodiment of the socket is for connection with an integrated circuit package 200 (FIG. 4) having a plastic body portion 202, and a plurality of lead sections 210; this embodiment of integrated circuit package being typically referred to as the "quad gull wing" package. This package 200 typically includes a square package body having sidewalls such as 204. A plurality of leads 210 extend from the body 202 having sections 212 extending downwardly from the body 202 and lead contact portions 214 provided at ends of the sections 212.

Figure 3:
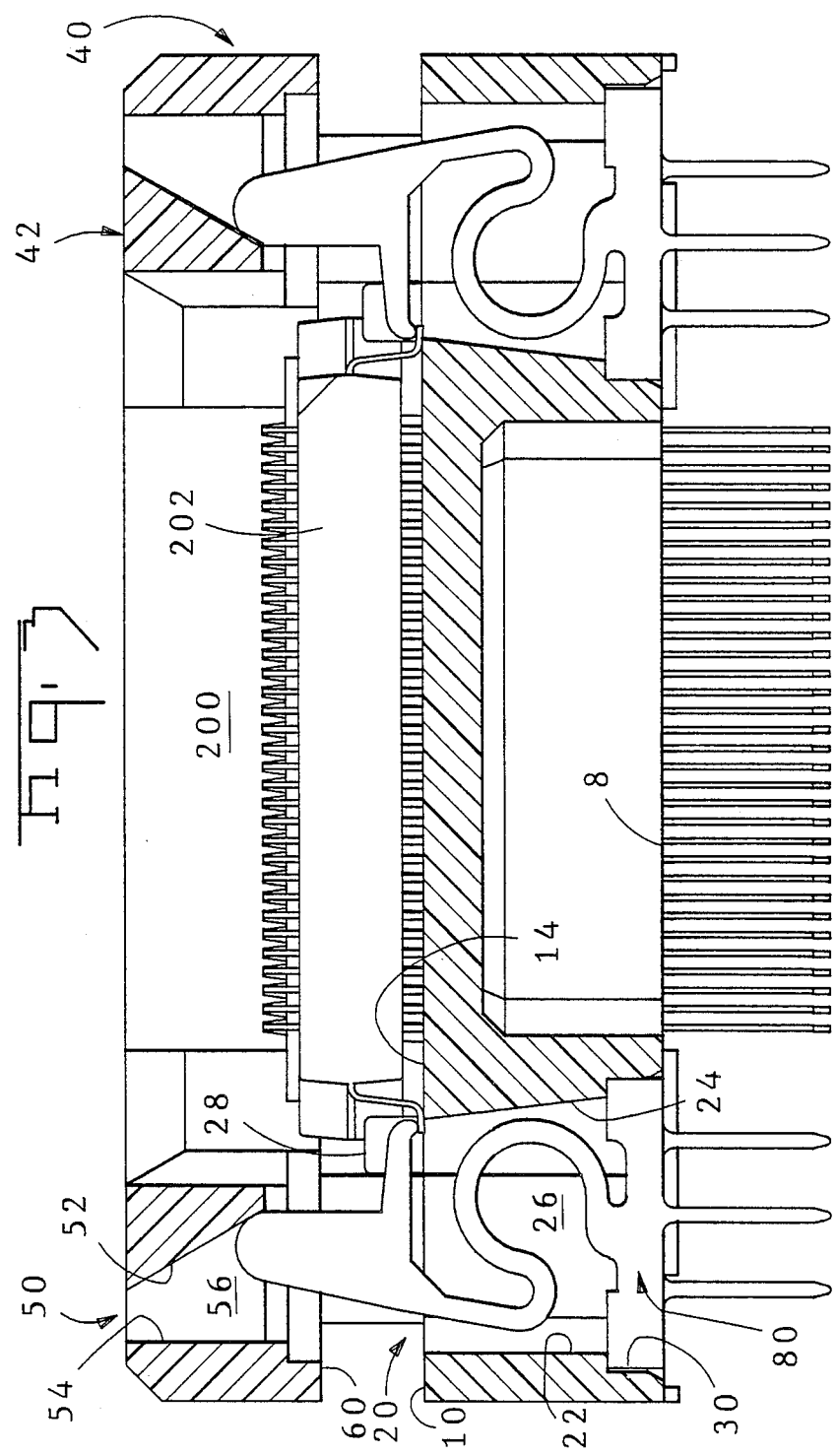
FIG. 3 is a cross sectional view through FIG. 1.

Referring again to FIG. 1, the socket 2 includes, as part of the housing 4, a plurality of sidewalls 6, a printed circuit board receiving face 8, and posts 12 upstanding in each of the corners of the housing 4. Referring now to FIG. 3, the housing 4 is shown in greater detail as including an upper stop surface 10 and a package receiving face 14. As shown in Figure 1, a plurality of contact receiving cavities 20 are located within the interior of the housing 4, and an upper portion of each cavity 20 extends to the upper stop surface 10.

Returning now to FIG. 3 shows that each of the contact receiving cavities 20 includes a rear surface 22, a forward surface 24, and side surfaces 26. The contact receiving cavity 20 opens fully through the upper stop face 10, and through the lower face 8. Adjacent to the lower face 8 is included an enlarged opening 30, as part of the cavity 20, which allows for receipt of the lower portion of the terminal. Portions 28 are included which extend above the face 14 and have surfaces which face each other to form a channel for the receipt of the lead ends of the package. Due to the location of the cross section of FIG. 3, only one facing surface is shown, however it should be appreciated that two facing surfaces are provided for each terminal location, that is, the channel formed by the two facing surfaces are centered relative to the terminal cavities 20.

With reference to FIG. 1, the camming member 40 is generally profiled for overlying the lower housing, with complementary features which allow for cooperation between the two, for example, the posts 12 which extend from the housing 4 are received in apertures 43, allowing relative movement between the two members. Furthermore, as mentioned before, the upper camming member 40 includes apertures 50 which are aligned with the cavities 20, which will be described in greater detail subsequently. The camming member 40 further includes an opening 46 through the central portion of the member, which is generally profiled for the receipt of an integrated circuit package such as 200. The camming member 40 further includes a plurality of apertures 50 which are generally shown in Figure 1, but which features are shown more clearly in FIG. 3. The apertures 50 generally include a rear edge 54, a forward edge 52 and sidewalls 56. The forward edge 52 is slanted and, in the preferred embodiment of the invention, is at an acute angle relative to vertical.

Figure 5:
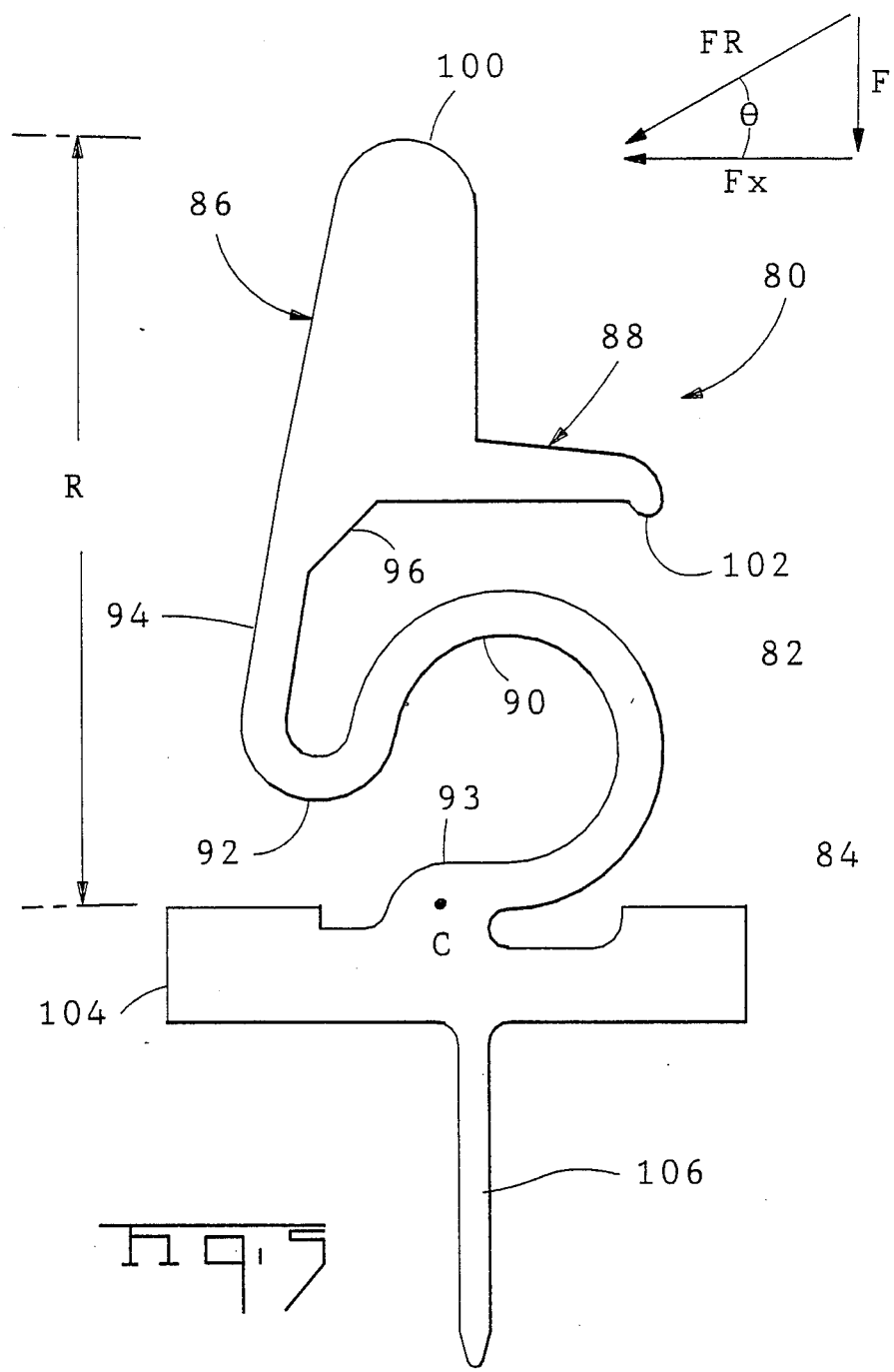
FIG. 5 is an enlarged view of the terminal.

Referring now to FIG. 5, the terminal 80 is shown generally including a spring portion 82, a printed circuit board portion 84, a camming portion 86, and a contact portion 88. The printed circuit board portion 88 generally comprises a bar portion 104 with a printed circuit board tab 106 extending downwardly therefrom. The spring portion 82 generally comprises a circular portion 90 which is integrally interconnected to the base portion 104 via an enlarged web portion 93. The circular spring portion 90 is further interconnected to a short section 94 via a bight portion 92, where the short section 92 is further interconnected to the camming member 86 through a transition section 96. The camming section 86 is generally comprised of an enlarged section 98 which has a contact point 100 at the inner upper tip. The contact arm 88 extends from an inner lower edge of the enlarged section 98 and has a contacting point 102 at the forward tip of the contact arm 88.

With reference now to FIG. 3, the contacts 80 are inserted through the lower face 8 into the respective apertures 20, such that the lower edge of the contact bar portion 104 is substantially flush with the lower face 8. As inserted, the spring portion 82 of the terminal 80 is disposed within the aperture portion 20 of the housing 4, while the camming portion 86 is positioned above the face 14. It should also be noted that the short section 94 of the terminals, as shown in FIG. 3, is spaced from the outer surface 22, when the terminal is in a non-stressed condition.

Figure 2:
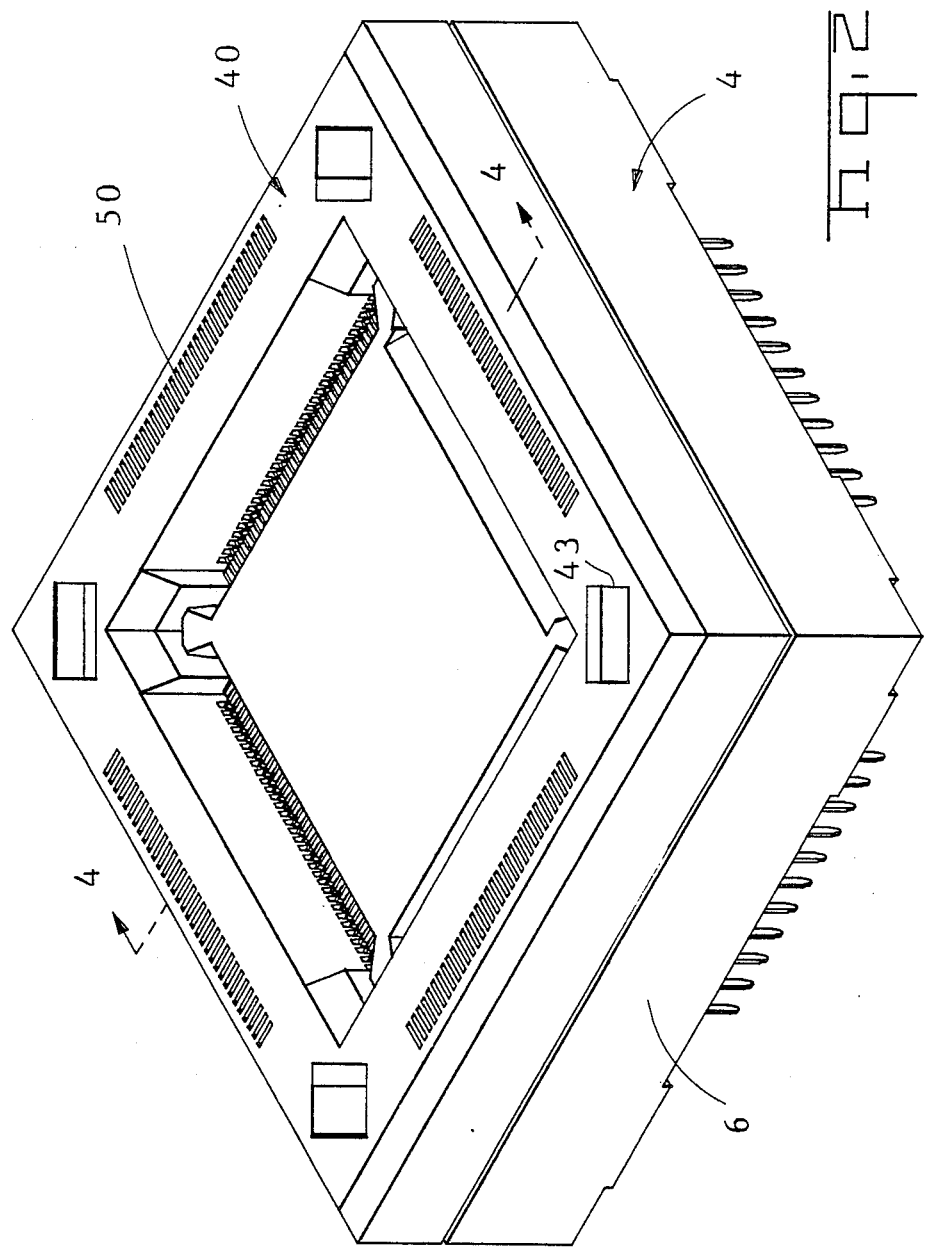
FIG. 2 is an isometric view of the connector in the disconnected condition.

Once the plurality of electrical terminals 80 are inserted within the cavities 20, the camming member 40 is insertable over the housing 4 and the two members 40 and 4 are latchable, one to the other. Although no specific latching feature is shown to interconnect the members 4 and 40 together, it should be appreciated that a latching shoulder could be formed, for example, on the housing posts 12, while recesses could be formed in the apertures 43 of the camming member 40. The latching recesses would be profiled to allow downward movement of the camming member, for example from the position shown in FIG. 1 to the position shown in FIG. 2, but would not allow removal of the camming member 40.

Figure 4:
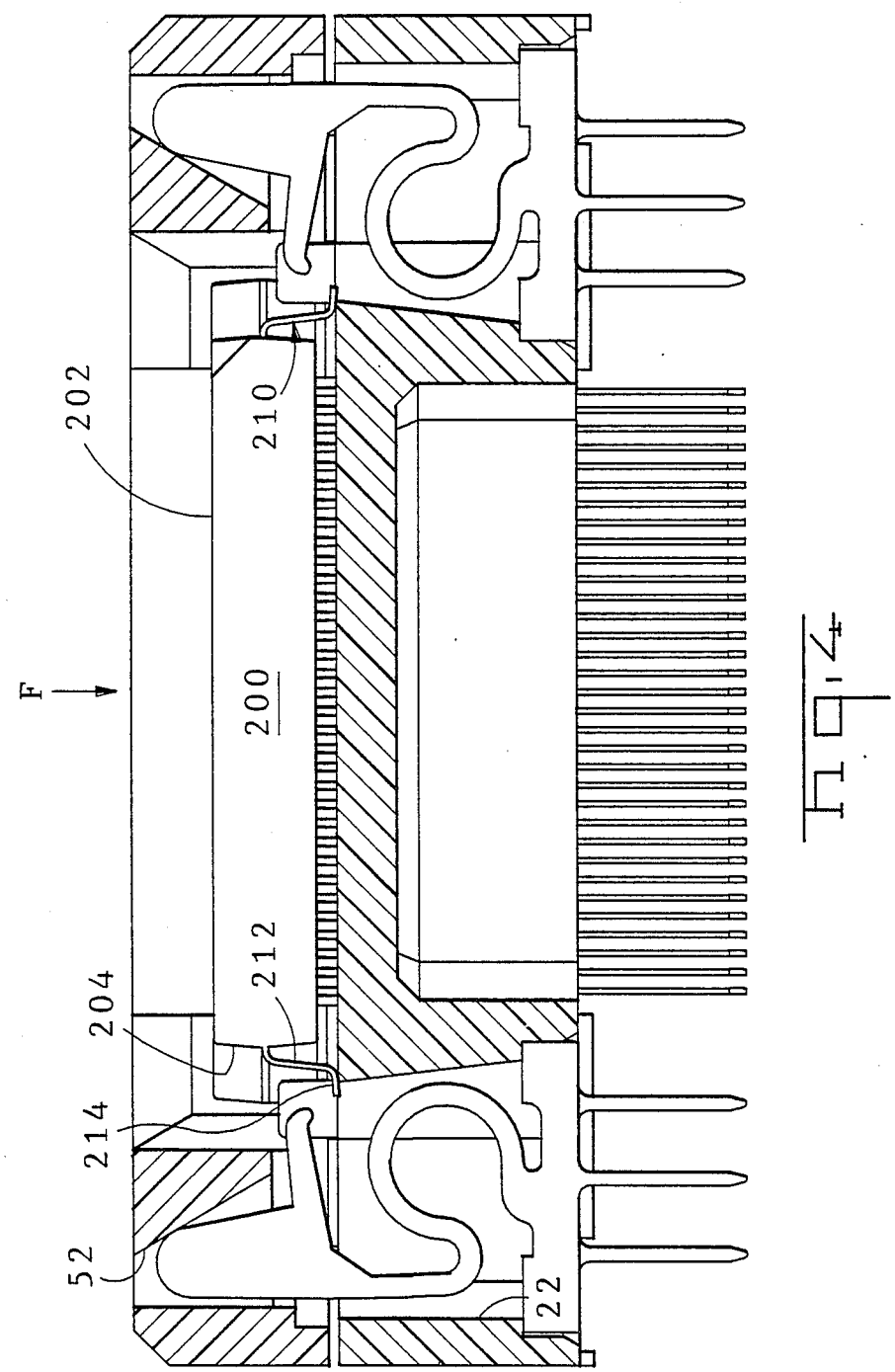
FIG. 4 is a cross sectional view through FIG. 2.

To insert an integrated circuit package 200, the camming member 50 is moved from the position shown in FIG. 3, to the position shown in FIG. 4. The movement of the camming member causes sliding engagement between the cam surface 52 and the contact portion 100 of the camming portion 86. Due to the cam surface 52 sliding relative to the contact point 100, a vertically downward movement of the camming member 40 translates into a horizontal movement of the terminal, which of course is a geometrical function of the angle $\theta$. Advantageously, the cam surface 52 is at an angle $\theta$ (FIG. 3) which is acute relative to vertical, thus downward vertical deflection is greater than the horizontal translation of the terminal, causing the mechanical advantage of the system to be greater than the prior art systems where the movement of the lid compared to the movement of the terminal is virtually one to one. In the preferred embodiment of the invention, the angle $\theta$ is approximately 30°.

It should also be appreciated that the resultant force between the cam surface 52 and that camming portion 86 will be normal to the surface 52, shown as $F_R$ in FIG. 5. Since, the movement of terminal relative to the movement of the camming member 40 is less than a one to one ratio, the force against the terminal is reciprocally multiplied to effect a camming or a wedging force against the terminal. However, it should be noted that none of the resultant force $F_R$ is opposing the rotation of the contacts 80; said differently, no component of the resultant force places an anti-torque on the terminals 80.

Furthermore, due to the lcoation of the applied force, the x component of the force acts through a moment arm R to create a moment $F_x \times R$ about the center of rotation C (FIG. 5). This is due to the application of a horizontal force on the terminals rather than a vertical force on the terminals, through the use of the camming surface 52. While the camming member 40 increases the height of the overall socket, as the camming member as designed requires more vertical travel, the height of the socket can be increased without adversely affecting the profile of the socket, as the footprint of the socket and the amount of printed circuit board space which the socket occupies, is still kept to a minimum.

As shown in FIG. 3, when the camming member is moved from the position shown in FIG. 3, to the position shown in FIG. 4, the camming member moves the contact arm 88 into and out of contact with the lead 214 of the integrated circuit package 200, for insertion and removal, respectively, of the integrated circuit package 200.

We claim:

1. An electrical connector for the electrical interconnection of an integrated circuit package having lead portions extending along side edges thereof, to traces on a printed circuit board, the connector comprising:

an insulative housing member having a lower base portion for mounting on a printed circuit board, the housing having sidewalls upstanding from the lower base portion which forms a nest for the integrated circuit package;

a plurality of electrical terminals having portions extending through the base portion for interconnection to the traces on the printed circuit board and contact portions which are disposed in the nest for interconnection to the integrated circuit package leads;

a lid portion which is disposed adjacent to an open upper face of the housing being movable towards and away from the base portion, the lid portion having a plurality of camming openings extending upwardly from a lower surface of the lid, the downward movement of the lid portion causing a camming surface of the lid portion to contact the terminals thereby forcing the terminal contact portions outwardly, from a center of the connector base portion, for insertion of the integrated circuit package, each terminal having a camming portion received within a single camming opening in the lid, each camming opening receiving the camming portion of only one terminal, wherein the camming surface is defined as a downwardly and outwardly facing surface within the camming opening, and wherein the camming surface is at an acute angle relative to vertical, and wherein the camming portions are located vertically above the terminal contact portions.

2. The connector of claim 1 wherein the camming surface is defined as a downwardly and outwardly facing surface within the camming opening.

3. The connector of claim 2 wherein the camming surface is at an acute angle relative to vertical.

4. An electrical connector for the electrical interconnection of an integrated circuit package having lead portions extending along side edges thereof, to traces on a printed circuit board, the connector comprising:

an insulative housing member having an upper face and a lower face for mounting on a printed circuit board, the housing member further comprising a plurality of side by side channels which extend around the periphery of the housing member;

a plurality of electrical terminals having foot portions extending through the lower face for interconnection to the traces on the printed circuit board, spring portions integral with the foot portions, the spring portions being disposed within the channels, and contact portions which are disposed proximate to the upper face, and extend inwardly towards a center of the housing member for interconnection to the integrated circuit package leads; and a cam engagement portion which is vertically above the contact portions;

a camming member which is disposed adjacent to, and above, the upper face of the housing being movable towards and away from the upper face, the camming member having camming openings which are aligned with the channels of the housing, the cam engagement portions of each terminal lying within a single camming opening, each camming opening receiving the cam engagement portion of only one terminal, the camming openings have camming surfaces which are in engagement with the cam engagement portions of the terminals, such that downward movement of the camming member forces the terminal contact portions outwardly, for insertion of the integrated circuit package.

5. The connector of claim 4 wherein the camming surface is defined as a downwardly and outwardly facing surface.

6. The connector of claim 5 wherein the camming surface is at an acute angle relative to vertical.

* * * * *